(12) United States Patent
Huebner et al.

(10) Patent No.: US 11,086,088 B2
(45) Date of Patent: Aug. 10, 2021

(54) LENS-LESS LASER MICRO-PACKAGE ASSEMBLY

(71) Applicant: Finisar Corporation, Sunnyvale, CA (US)

(72) Inventors: Bernd Huebner, Mountain View, CA (US); Tsurugi Sudo, San Jose, CA (US); Shiyun Lin, San Diego, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 158 days.

(21) Appl. No.: 16/555,701

(22) Filed: Aug. 29, 2019

(65) Prior Publication Data

US 2020/0073065 A1   Mar. 5, 2020

Related U.S. Application Data

(60) Provisional application No. 62/725,811, filed on Aug. 31, 2018.

(51) Int. Cl.
*G02B 6/42*   (2006.01)
*G02B 6/26*   (2006.01)

(52) U.S. Cl.
CPC .......... *G02B 6/4228* (2013.01); *G02B 6/4226* (2013.01); *G02B 6/4238* (2013.01); *G02B 6/26* (2013.01)

(58) Field of Classification Search
CPC .. G02B 6/4228; G02B 6/4226; G02B 6/4238; G02B 6/26; G02B 6/4244; G02B 6/4245; G02B 6/4256; G02B 6/4257; G02B 6/4259; G02B 6/426; G02B 6/4262
See application file for complete search history.

(56) References Cited

U.S. PATENT DOCUMENTS 10,222,565 B2 *   3/2019   Kinghorn ................ H01L 31/18

* cited by examiner

*Primary Examiner* — John Bedtelyon
(74) *Attorney, Agent, or Firm* — Blank Rome LLP

(57) ABSTRACT

An optoelectronic assembly may include a photonic integrated circuit (PIC) with a top surface and a laser with a top surface and a bottom surface. The optoelectronic assembly may also include a housing configured to cooperate with the PIC to one or both of house and support one or more components. The housing may include a PIC mount including a first surface to interface with the top surface of the PIC, and a laser mount including a second surface to interface with the top or bottom surface of the laser. The first surface and the second surface may be parallel to each other.

28 Claims, 10 Drawing Sheets

LENS-LESS LASER MICRO-PACKAGE ASSEMBLY

CROSS-REFERENCE TO RELATED APPLICATION

This application claims the benefit of and priority to U.S. Provisional App. No. 62/725,811. The 62/725,811 application is incorporated herein by reference.

FIELD

Some embodiments described herein generally relate to a lens-less laser micro-package assembly (LLAMA).

BACKGROUND

Unless otherwise indicated herein, the materials described herein are not prior art to the claims in the present application and are not admitted to be prior art by inclusion in this section.

Optoelectronic components may be used in the conversion of optical signals to electrical signals and/or electrical signals to optical signals. The manner in which various optoelectronic components are assembled or coupled together may affect a quality or amount of conversion efficiency for a desired signal output. For example, various couplings between optoelectronic components may perform as intended when angles relative to each other are within certain tolerances and/or when various interfaces of the optoelectronic components are within certain tolerances. Imprecisions, stacked tolerances, or other accumulated variations may lead to coupling losses or efficiency losses beyond an acceptable amount.

Further, coupling light from single mode edge emitting lasers to silicon (Si) photonics may be costly, as it generally requires two lenses and a large isolator block. In systems that include such lasers and Si photonics, alignment tolerances may be less than 0.5 micrometers (μm). Such low alignment tolerances may typically require active alignment to be met.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein generally relate to a lens-less laser micro-package assembly, e.g., that may be implemented as or in one or more optoelectronic assemblies.

In an example embodiment, an optoelectronic assembly may include a photonic integrated circuit (PIC) with a top surface and a laser with a top surface and a bottom surface. The optoelectronic assembly may also include a housing configured to cooperate with the PIC to one or both of house and support one or more components. The housing may include a PIC mount including a first surface to interface with the top surface of the PIC, and a laser mount including a second surface to interface with the top or bottom surface of the laser. The first surface and the second surface may be parallel to each other.

In another example embodiment, a method to manufacture an optoelectronic assembly may include etching a wafer to form multiple housings in the wafer. The housings in the wafer may house a laser and/or an optical isolator. The method may also include forming a receptacle in each housing in the wafer. Additionally, the method may include forming a PIC mount of each of the housings in the wafer. Each PIC mount may include a first surface to interface with a top surface of a corresponding PIC. The method may also include forming a laser mount of each of the housings in the wafer. Each laser mount may include a second surface to interface with a top surface or a bottom surface of a corresponding laser. The first surface and the second surface may be parallel to each other.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific implementations thereof which are illustrated in the appended drawings. It is appreciated that these drawings depict only typical implementations of the invention and are therefore not to be considered limiting of its scope. The invention will be described and explained with additional specificity and detail using the accompanying drawings in which.

DESCRIPTION OF EMBODIMENTS

Figure 1:
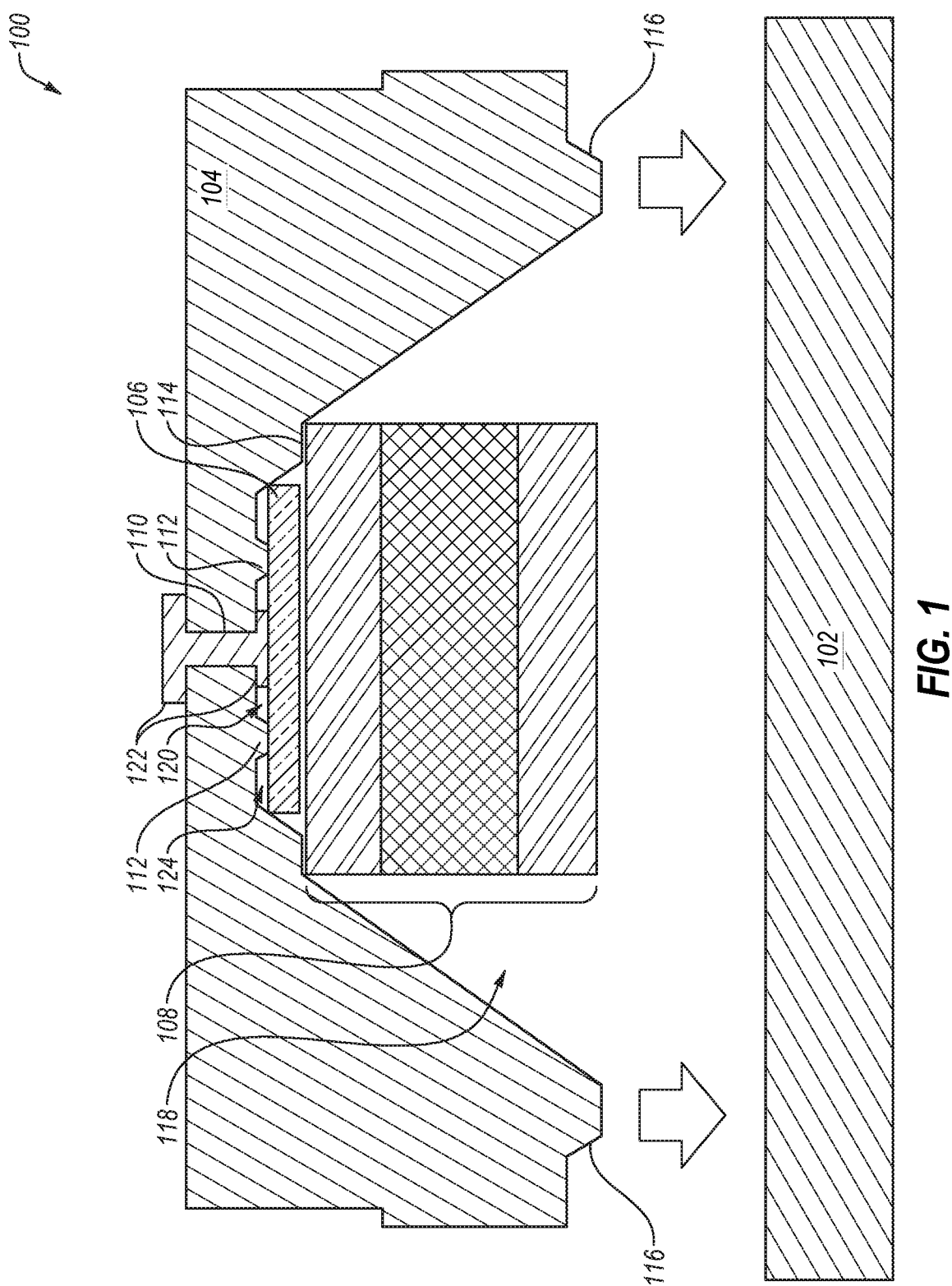
FIG. 1 is a cross-sectional side view of an example optoelectronic assembly.

U.S. application Ser. No. 15/834,040, filed on Dec. 6, 2017 (hereinafter the '040 application), and U.S. Publication No. 2017/0179680, published Jun. 22, 2017 (hereinafter the '680 publication) are incorporated herein by reference.

Some embodiments described herein and/or in the '040 application and the '680 publication remove the need for lenses in systems such as those described in the BACKGROUND, which may reduce part count and cost, and significantly simplify packaging processes in such systems. An isolator may be used in such systems, and, for example, the laser and isolator may be assembled and tested prior to bonding to a Si photonics integrated circuit (PIC). The reduced complexity and absence of lenses in such systems may significantly reduce the size and cost of the isolator and may significantly increase alignment tolerances. For example, the alignment tolerance may be increased by a factor of 10 or even 50 or more from about 0.1 μm (or about 0.1 degree angle tolerance) which typically has to be done by active feedback alignment, which requires turning on the laser during alignment, to about 1-2 μm or even 5-8 μm or more achieved in a passive alignment pick-and place machine; i.e. without having to turn on the laser.

Further, embodiments herein may enable parallelism between the laser and the PIC, thereby helping to reduce coupling losses that may result from imprecisions, stacked tolerances, or other accumulated variations. Additionally or alternatively, embodiments described herein may enable wafer level testing of lasers. In these and other embodiments, thermal paths and electrical contacts may be provided to the lasers. Various embodiments of the present disclosure may also include a laser with a large output mode size and a small divergent angle, and/or embodiments which may use various controlled surfaces to increase alignment tolerances and/or promote greater beam propagation through thick isolators. Controlled surfaces may include surfaces that are formed to have a specific relationship to each other within a specified tolerance. For instance, controlled surfaces may include two different surfaces of a structure where the two different surfaces are formed to be parallel to each other within a specific tolerance.

In an example embodiment, an optoelectronic assembly may include a PIC, a laser, and a housing. Various configurations of the housing may contribute to the above-mentioned example advantages of the present disclosure according to some embodiments. For example, the housing may have various tightly controlled surfaces, which may correspond to respective elements such as the PIC and the laser. At the various tightly controlled surfaces, the respective elements may be mounted or otherwise bonded to the tightly controlled surfaces of the housing. In doing so, parallelism between the laser and the PIC, for example, may be ensured since the tightly controlled surfaces may be parallel to each other. In these and other embodiments, additional elements may be mounted or otherwise bonded to the tightly controlled surfaces of the housing, such as an isolator. In contrast to methods where the laser, the isolator, and the PIC are stacked and bonded together, embodiments of the present disclosure decouple one or more of the above components from each other to, instead, interface with corresponding tightly controlled surfaces of a single element, the housing.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

FIG. 1 is a cross-sectional side view of an example optoelectronic assembly 100, arranged in accordance with at least one embodiment described herein. As illustrated, the optoelectronic assembly 100 may include a PIC 102, a housing or LLAMA 104, a grating coupled laser (hereinafter "GCL" or "GCL laser") 106, an optical isolator 108 (hereinafter "isolator"), one or more vias 110 for laser contacts, and various mounts, including laser stands 112, isolator stands 114, and PIC stands 116, collectively referred to as mounts or stands 112, 114, 116.

In these or other embodiments, the housing 104 may cooperate with the PIC 102 to house, e.g., at least partially enclose, one or more elements such as the GCL laser 106 and the isolator 108. Additionally or alternatively, one or more elements such as the GCL laser 106 and the isolator 108 may be housed and/or positioned inside a cavity or receptacle 118 of the housing 104 to help provide parallelism as discussed in greater detail below upon further introduction to the GCL laser 106, the PIC 102, and the isolator 108.

Example features, aspects, and/or embodiments of the GCL laser 106, the PIC 102, and the isolator 108 are described in greater detail in the '040 application and the '680 publication. Accordingly, the GCL laser 106 of FIG. 1 may include one or more grating coupled lasers. For example, the grating coupled laser may include an indium phosphide (InP) laser or other suitable edge emitting laser, a fan out region, and/or a surface grating. The InP laser may include an input passive waveguide that expands in the fan out region to the surface grating. The surface grating may be configured to generate a relatively large optical mode spot size of about 8-40 μm for an optical beam diffracted by the surface grating. The surface grating may be referred to as a transmit grating when combined with the edge emitting laser and the fan out region to couple light out of the edge emitting laser. Such an edge emitting laser formed in the same chip with a transmit grating may be referred to herein as a GCL laser.

Additionally or alternatively, the GCL laser 106 may include a first surface grating (or transmit grating), and the PIC 102 may include a second surface grating (or receive grating). The first surface grating may be optically coupled to an active section of the GCL laser 106 through a core waveguide. The core waveguide may be optically coupled to receive light emitted by a gain medium of the active section of the GCL laser 106. In some embodiments, a fan out region may be provided between the core waveguide and the first surface grating and/or may include the core waveguide. The fan out region may be formed from a same medium and layer as the core waveguide such that the fan out region may generally be an extension of the core waveguide. Additionally, the fan out region may include grating lines such that the fan out region may generally be an extension of the first surface grating.

The light emitted from the active section of the GCL laser 106 may travel through the core waveguide to the fan out region, where a mode of the light may be expanded laterally. The first surface grating may diffract the light with the laterally expanded mode generally downward (or at least in a direction with a downward component) as diffracted light. The diffracted light may be diffracted toward the second surface grating of the PIC 102. The mode of the diffracted light may be expanded to a 8-40 μm spot size (lateral measurement) within the fan out region while simultaneously being expanded along the direction of the active section by the first surface grating. One potential benefit of this method of expanding diffracted light may be that the spot size may be much larger than the 2 to 4 μm spot size that can be achieved with standard spot size converters.

The diffracted light may be received by the second surface grating. The diffracted light may be redirected by the second surface grating into a waveguide of the PIC 102. As an example, the waveguide of the PIC 102 may include a Si waveguide.

The diffracted light may pass through the isolator 108 before reaching the second surface grating of the PIC 102. The isolator 108 may be configured to reduce or eliminate back reflection.

In an example embodiment, the isolator 108 may include a first polarizer, a Garnet or other Faraday Rotator, and a second polarizer. Additionally or alternatively, the isolator 108 may include one or more surfaces, such as a top surface, that includes a coating such as an anti-reflective coating. Additionally or alternatively, the isolator 108 may include one or more optical wave plates such as one or more quarter-wave plates and/or one or more half-wave plates to manipulate a polarization state of optical signals. The one or more optical wave plates may be provided at and/or attached to a bottom of the isolator 108 or other suitable location of the isolator 108.

Some embodiments may stack the various components disclosed in, e.g., the '040 application and/or the '680 publication, together. For example, some embodiments may include the GCL laser 106 stacked on the isolator 108 stacked on the PIC 102, optionally with a laser optical interposer (LOI) stacked between the isolator and the PIC 102. As previously indicated, such a stacked arrangement may result in stacked tolerances and/or accumulated variations that may lead to significant coupling losses.

Given the foregoing relationship between the GCL laser 106, the PIC 102, and the isolator 108, embodiments of the present disclosure may implement the housing 104 with controlled surfaces to respectively interface with one or more of the above elements. Some embodiments of the housing 104 described herein may reduce coupling loss compared to stacked arrangements by eliminating, or at least reducing, stacked tolerances and/or accumulated variations.

For example, the mounts 112, 114, 116 of the housing 104 in FIG. 1 may include the controlled surfaces. Specifically, for instance, one or more laser mounts, such as the laser stands 112, may include a controlled surface of the housing 104 corresponding to a top surface of the GCL laser 106. The laser mount(s) or the laser stand(s) 112 may correspond to the top surface of the GCL laser 106 in the sense that the laser mount(s) or laser stand(s) 112 may include a surface of the housing 104 to which the top surface of the GCL laser 106 may be coupled.

In some embodiments, one or more isolator mounts, such as the isolator stands 114, may include a controlled surface of the housing 104 corresponding to a top surface of the isolator 108. The isolator mount(s) or isolator stand(s) 114 may correspond to the top surface of the isolator 108 in the sense that the isolator mount(s) or isolator stand(s) 114 may include a surface of the housing 104 to which the top surface of the isolator 108 may be coupled.

Additionally or alternatively, one or more PIC mounts, such as the PIC stands 116, may include a controlled surface of the housing 104 corresponding to a top surface of the PIC 102. The PIC mount(s) or PIC stand(s) 116 may correspond to the top surface of the PIC 102 in the sense that the PIC mount(s) or PIC stand(s) 116 may include a surface of the housing 104 to which the top surface of the PIC 102 may be coupled. In these or other embodiments, the respective controlled surfaces of the PIC mount(s) or stand(s) 116, the isolator mount(s) or stand(s) 114, and/or the laser mount(s) or stand(s) 112 may result in relative, approximate parallelism between the PIC 102, the isolator 108, and the GCL laser 106 since the PIC mount(s) or stand(s) 116, the isolator mount(s) or stand(s) 114, and/or the laser mount(s) or stand(s) may be approximately parallel to each other.

In these or other embodiments, any of the laser mount(s) or stand(s) 112, the isolator mount(s) or stand(s) 114, and the PIC mount(s) or stand(s) 116 may include or may be part of a waffle-like structure within the receptacle 118 of the housing 104. As referred to herein, the waffle-like structure may include one or more surfaces that are raised relative to one or more adjacent surfaces such that one or more cavities are defined. For example, according to the example embodiment of FIG. 1, the two laser mounts 112 may be raised or protrude from a cavity surface 120 located between the two laser mounts 112 thereby forming a first cavity (e.g., for the via(s) 110 and one or more contact pads 122). Additionally or alternatively, the laser mounts 112 may be raised or protrude from another cavity surface 124 (e.g., adjacent to outer sides of the laser mounts 112) as shown in FIG. 1, thereby forming one or more additional cavities. The contact pad 122 inside the receptacle 118 in FIG. 1 may electrically couple the GCL laser 106 to the via 110. The contact pad 122 outside the receptacle 118 in FIG. 1 may electrically couple the via 110, and thus the GCL laser 106, to one or more external components (not shown in FIG. 1).

In some embodiments, the isolator mounts 114 may be raised or protrude from a cavity surface, such as the cavity surface 124. In these or other embodiments, any of the laser mounts 112, the isolator mounts 114, and the PIC mounts 116 may share adjacent cavity surfaces and/or cavities. For example, as shown in the example embodiment of FIG. 1, the laser mounts 112 and the isolator mounts 114 may protrude from the same cavity surface 124 therebetween. Additionally or alternatively, a cavity and/or a cavity surface may not be required on both sides of any of the laser mounts 112, the isolator mount 114, and the PIC mounts 116 for the housing 104 to qualify as having a waffle structure. For example, the isolator mounts 114, as shown in FIG. 1, may protrude from the cavity surface 124 on one side adjacent to the isolator mounts 114, but not on the other side in which the receptacle wall proceeds towards the PIC mounts 116. In some embodiments, one or more of the cavities defined by the waffle-like structure may be at least partially filled with an adhesive such as epoxy to bond the cavity surface and/or the corresponding mount to another component (e.g., the GCL laser 106, the optical isolator 108, or the PIC 102).

In a top view or a bottom view, the housing 104 of FIG. 1 may have an outer perimeter that is square, rectangular, or other suitable shape. Each of the PIC mounts 116, the isolator mounts 114, and the laser mounts 112 may have a same or similar shape. For example, if the outer perimeter of the housing of FIG. 1, when viewed from above or below, is square (or other shape), the PIC mounts 116 may be or include a square (or other shape) stand (when viewed from above or below) with a perimeter that is generally parallel to the outer perimeter of the housing 104. Similarly, the isolator mounts 114 may be or include a square (or other shape) stand (when viewed from above or below) with a perimeter that is generally parallel to the outer perimeter of the housing 104. Similarly, the laser mounts 112 may be or include a square (or other shape) stand (when viewed from above or below) with a perimeter that is generally parallel to the outer perimeter of the housing 104. In other embodiments, one or more of the PIC mounts 116, the isolator mounts 114, and the laser mounts 112 may have a different shape than the outer perimeter of the housing 104.

As also illustrated in FIG. 1, each of the GCL laser 106, the isolator 108, and the PIC 102 may be configured to be bonded to the housing 104 but not to each other. In this manner, surface imperfections and/or stacked tolerances may not amount to excessive tilt angles that may otherwise (if bonded together) accumulate between the GCL laser 106, the isolator 108, and the PIC 102. Thus, each element may be offset relative to each other.

To geometrically achieve the relative offsets, the housing 104 may include one or more step features in the receptacle 118 within which the TCL laser 106 and the isolator 108 may be received such that a step size between the laser mounts 112 and the isolator mounts 114 may determine the respective offsets. The step sizes may be different depending on the size of the element. For example, the GCL laser 106 may be relatively small in an arbitrarily-defined y-direction compared to the isolator 108. The y-direction is defined herein as being parallel to the vertical direction in, e.g., FIGS. 1-4. As a result, the step size between the PIC mounts 116 and the isolator mounts 114 may be larger than the step size between the isolator mounts 114 and the laser mounts 112. In these or other embodiments, and as further described below, the step sizes and the receptacle 118 in general may be formed in a fabrication process that includes lithography and etching (e.g., wet etching, dry etching). Additionally or alternatively, the step sizes may be dependent on a desired or specified offset distance between one or more of the GCL laser 106, the isolator 108, and the PIC 102.

In some embodiments, the receptacle 118 of the housing 104 may be defined by various surfaces and walls. For example, the receptacle 118 may be positioned in a central portion of the housing 104 and may include partial bounds such as side walls (part of a step in a step size described above) that connect the PIC mounts 102 and the isolator mounts 114. Other partial bounds of the receptacle 118 may include the isolator mounts 114 and/or the laser mounts 112 themselves. Additionally or alternatively, wall surfaces between the isolator mounts 114 and the laser mounts 112 may partially bound the receptacle 118 of the housing 104. In these or other embodiments, the various surfaces and walls partially bounding the receptacle 118 may be angled relative to the y-direction, approximately parallel to the y-direction, or approximately perpendicular to the y-direction. Thus, slopes of the various surfaces of the receptacle 118 may be the same as or different from each other, depending on a desired application and/or fabrication process. For example, dry etching (e.g., on Silicon) may allow one or more side walls to be formed approximately parallel to the y-direction.

The vias 110 may be disposed and/or formed in the housing 104. For example, one or more of the vias 110 may extend between the top surface of the housing 104 and the receptacle 118. Additionally or alternatively, one or more of the vias 110 may thermally and/or electrically couple the GCL laser 106 to an element positioned outside the housing 104 (e.g., to an element positioned on the top surface of the housing 104).

Figure 2:
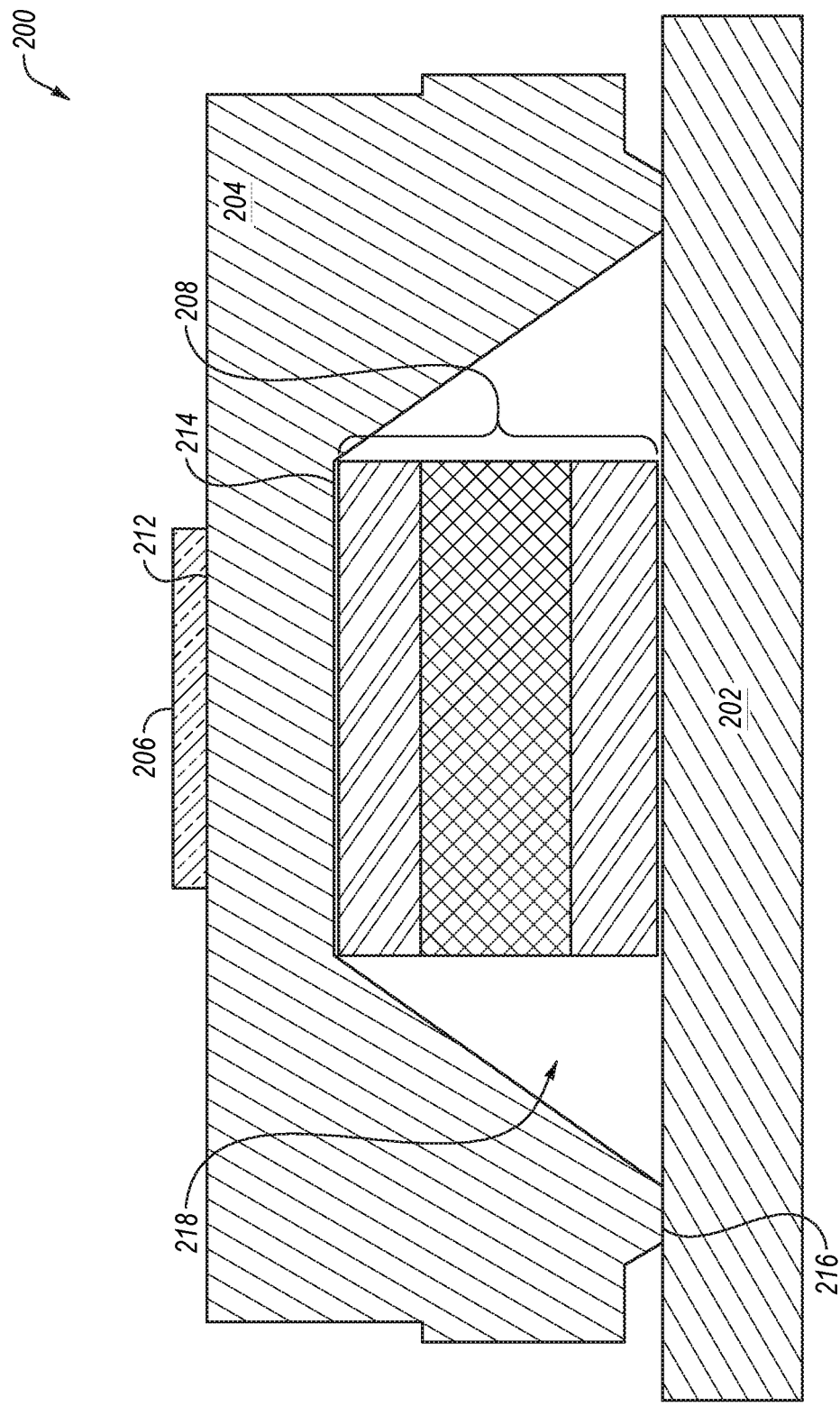
FIG. 2 is a cross-sectional side view of another example optoelectronic assembly.

FIG. 2 is a cross-sectional side view of another example optoelectronic assembly 200, arranged in accordance with at least one embodiment described herein. As illustrated, the optoelectronic assembly may include a PIC 202, a housing or LLAMA 204, a GCL laser 206, an optical isolator (hereinafter "isolator") 208, a laser mount 212, an isolator mount 214, and a PIC mount 216 (collectively "mounts 212, 214, 216"). The PIC 202, the GCL laser 206, and the isolator 208 of FIG. 2 may be the same as or similar to the PIC 102, GCL laser 106, and the isolator 108 of FIG. 1.

In these or other embodiments, the housing 204 may cooperate with the PIC 202 to house one or more elements such as the isolator 208. Additionally or alternatively, the isolator 208 may be housed inside a cavity or receptacle 218 of the housing 204, and the GCL laser 206 may be positioned on a top surface of the housing 204 outside of the receptacle 218 such that the housing 204 is positioned between the GCL laser 206 and the isolator 208. Thus, in some embodiments, the housing 204 may be optically transparent to allow optical signals to pass from the GCL laser 206, through the housing 204, through the isolator 208, and to the PIC 202.

In some embodiments, the mounts 212, 214, 216 in FIG. 2 may include controlled surfaces. Specifically, for instance, the laser mount 212 may include a controlled surface of the housing 204 that corresponds to a bottom surface of the GCL laser 206. In some embodiments, the isolator mount 214 may include a controlled surface of the housing 204 that corresponds to a top surface of the isolator 208. Additionally or alternatively, the PIC mount 216 may include a controlled surface of the housing 204 that corresponds to a top surface of the PIC 202. In these or other embodiments, the respective controlled surfaces of the PIC mount 216, the isolator mount 214, and the laser mount 212 may result in relative, approximate parallelism between the PIC 202, the isolator 208, and the GCL laser 206 since the PIC mount 216, the isolator mount 214, and the laser mount 212 may be approximately parallel to each other.

As also illustrated in FIG. 2, each of the GCL laser 206, the isolator 208, and the PIC 202 may be bonded to the housing 204 but not to each other. In this manner, surface imperfections and/or stacked tolerances may not amount to excessive tilt angles that may otherwise (if bonded together) accumulate between the GCL laser 206, the isolator 208, and the PIC 202. Thus, each element may be offset relative to each other.

To geometrically achieve the relative offsets, the housing 204 may include one or more step features in the receptacle 218 such that a step size between the mounts 212, 214, 216 may determine the respective offsets. Additionally or alternatively, the receptacle 218 itself may be a single step size between the isolator mount 214 and the PIC mount 216. For example, in a left-to-right or side-to-side example description of FIG. 2, a surface of the receptacle 218 of the housing 204 may elevate from the PIC mount 216, plateau at the isolator mount 214 and proceed laterally, and then de-elevate back to the PIC mount 216 on an opposing side. In these or other embodiments, and as further described below, the receptacle 218 may be formed in a fabrication process that includes lithography and etching (e.g., wet etching, dry etching). Additionally or alternatively, a depth of the receptacle 218 may be dependent on a desired or specified offset distance between one or more of the GCL laser 206, the isolator 208, and the PIC 202.

In some embodiments, the receptacle 218 of the housing 204 may be defined by various surfaces and walls. For example, the receptacle 218 may be positioned in a central portion of the housing 204 and may include partial bounds such as side walls with a slope described above connecting the PIC mount(s) 216 and the isolator mount(s) 214. Other partial bounds of the receptacle 218 may include the isolator mount 214. In these or other embodiments, the various surfaces and walls partially bounding the receptacle 218 may be angled relative to the y-direction, approximately parallel to the y-direction, or approximately perpendicular to the y-direction. Thus, slopes of the various surfaces of the receptacle 218 may be the same or different, depending on a desired application and/or fabrication process. For example, dry etching (e.g., on Silicon) may allow one or more side walls to be formed approximately parallel to the y-direction.

Figure 3:
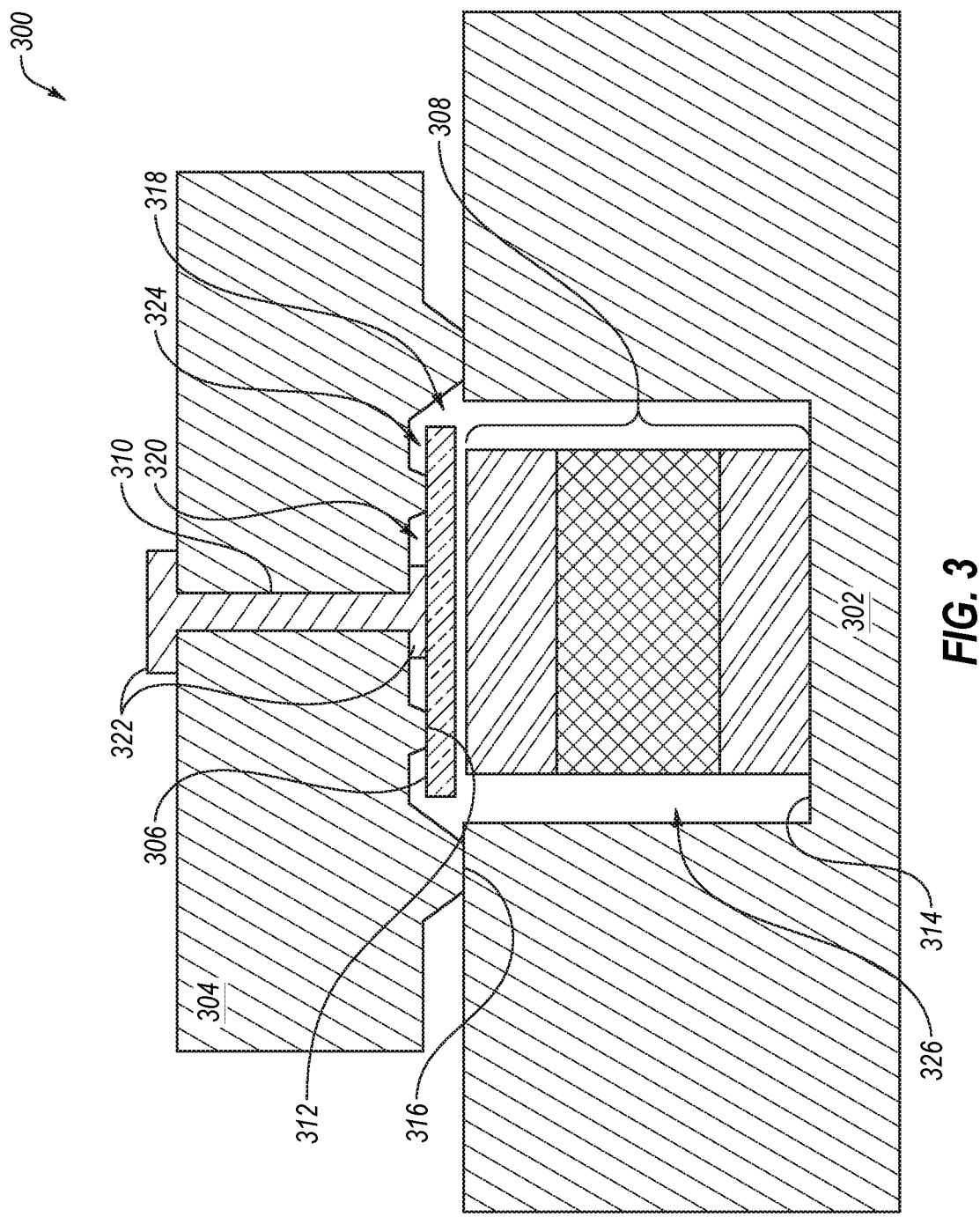
FIG. 3 is a cross-sectional side view of another example optoelectronic assembly.

FIG. 3 is a cross-sectional side view of another example optoelectronic assembly 300, arranged in accordance with at least one embodiment described herein. As illustrated, the optoelectronic assembly 300 may include a PIC 302, a housing or LLAMA 304, a GCL laser 306, an optical isolator (hereinafter "isolator") 308, one or more vias 310, a laser mount 312, an isolator mount 314, and a PIC mount 316 (collectively "mounts 312, 314, 316"), and one or more contact pads 322. The PIC 302, the GCL laser 306, the vias 310, the isolator 308, and the contact pads 322 of FIG. 3 may be the same as or similar to the PIC 102, 202, the GCL laser 106, 206, the vias 110, the isolator 108, 208, and the contact pads 122 of FIGS. 1 and/or 2.

In these or other embodiments, the housing 304 may cooperate with the PIC 302 to house one or more elements such as the GCL laser 306 and the isolator 308. Additionally or alternatively, some or all of the GCL laser 306 and/or the isolator 308 may be at least partially received inside a recess 326 of the PIC 302.

In some embodiments, the mounts 312, 314, 316 in FIG. 3 may include controlled surfaces. Specifically, for instance, the laser mount 312 may include a controlled surface of the housing 304 that corresponds to a top surface of the GCL laser 306. In some embodiments, the isolator mount 314 may include a controlled surface of the PIC 302 that corresponds to a bottom surface of the isolator 308. For example, the controlled surface of the PIC 302 may be a top surface in the recess 326 and/or at the bottom of the recess 326. In other embodiments, the isolator mount 314 or top surface at the bottom of the recess 326 may not be or include a controlled surface. Additionally or alternatively, the PIC mount 316 may include a controlled surface of the housing 304 that corresponds to a top surface of the PIC 302 outside of the recess. In these or other embodiments, the respective controlled surfaces of at least the PIC mount 316 and the laser mount 312 may result in relative, approximate parallelism between the PIC 302 and the GCL laser 306 since the PIC mount 316 and the laser mount 312 may be approximately parallel to each other.

In these or other embodiments, any of the laser mount 312, the isolator mount 314, and the PIC mount 316 may include or may be part of a waffle-like structure within the receptacle 318. For example, according to the example embodiment of FIG. 3, two laser mounts 312 may be raised or protrude from a cavity surface 320 that is positioned between the laser mounts 312, thereby forming a first cavity (e.g., for at least a portion of the via(s) 310 and/or contact pad(s) 322). Additionally or alternatively, the laser mount 312 may be raised or protrude from another cavity surface 324 (e.g., adjacent to outer sides of the laser mounts 312 as shown in FIG. 3, thereby forming one or more additional cavities).

In some embodiments, the PIC mount 316 may be raised or protrude from a cavity surface, such as the cavity surface 324. In these or other embodiments, any of the laser mount 312, the isolator mount 314, and the PIC mount 316 may share adjacent cavity surfaces and/or cavities. For example, as shown in the example embodiment of FIG. 3, the laser mounts 312 and the PIC mounts 316 protrude from the same cavity surface 324 therebetween. Additionally or alternatively, a cavity and/or a cavity surface may not be required on both sides of any of the laser mount 312, the isolator mount 314, and the PIC mount 316 for the housing 304 to qualify as having a waffle structure. In other embodiments, a cavity on both sides of one or more of the mounts 312, 314, 316 may help reduce a probability of any conflict between controlled surfaces of the mounts 312, 314, 316 and uncontrolled surfaces and/or help reduce an amount of surfaces to control.

As also illustrated in FIG. 3, both of the GCL laser 306 and the PIC 302 may be configured to be bonded to the housing 304 but not to each other. Similarly, the GCL laser 306 may not be bonded to the isolator 308. In this manner, surface imperfections and/or stacked tolerances may not amount to excessive tilt angles that may otherwise (if bonded together) accumulate between the GCL laser 306 and the PIC 302 and between the GCL laser 306 and the isolator 308. Thus, at least the GCL laser 306 may be offset relative to the isolator 308 and the PIC 302.

To geometrically achieve the relative offsets, the housing 304 may include one or more step features in the receptacle 318 such that a step size between the mounts 312, 314, 316 may determine the respective offsets. The step sizes may be different depending on the size of the element. In these or other embodiments, and as further described below, the step sizes and the receptacle 318 in general may be formed in a fabrication process that includes lithography and etching (e.g., wet etching, dry etching). Additionally or alternatively, the step sizes may be dependent on a desired or specified offset distance between one or more of the GCL laser 306, the isolator 308, and the PIC 302.

In some embodiments, the receptacle 318 of the housing 304 may be defined by various surfaces and walls. For example, the receptacle 318 may be positioned and/or defined in a central portion of the housing 304 and may include partial bounds such as side walls (part of a step in a step size described above) that connects the PIC mount 316 and the laser mount 312. Other partial bounds of the receptacle 318 may include the laser mount 312 itself. Additionally or alternatively, wall surfaces between the laser mount(s) 312 and/or between the PIC mount(s) 316 may partially bound the receptacle 318 of the housing 304. In these or other embodiments, the various surfaces and walls partially bounding the receptacle 318 may be angled relative to the y-direction, approximately parallel to the y-direction, or approximately perpendicular to the y-direction. Thus slopes of the various surfaces of the receptacle 318 may be the same or different, depending on a desired application and/or fabrication process. For example, dry etching (e.g., on Silicon) may allow one or more side walls to be formed approximately parallel to the y-direction.

Figure 4:
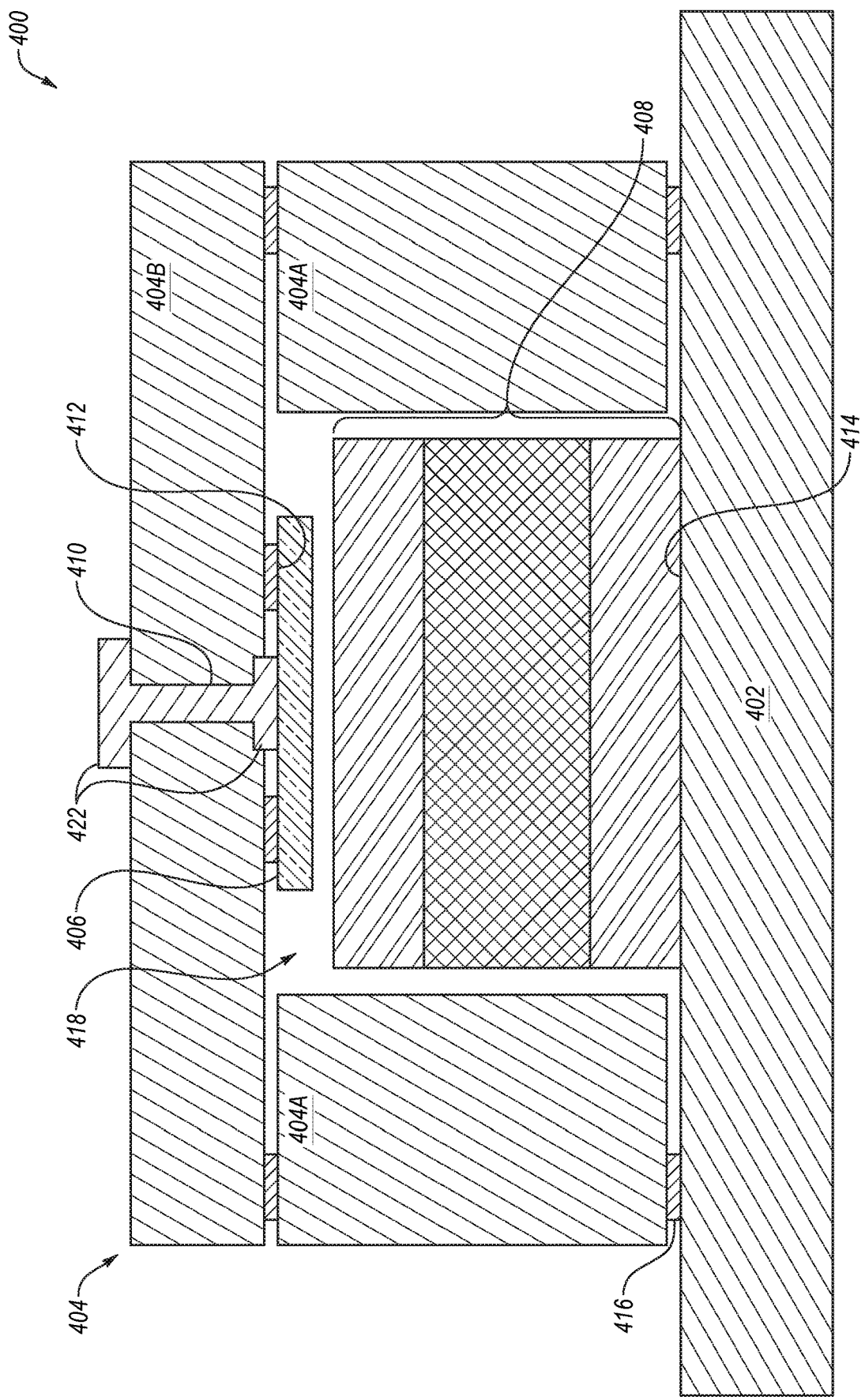
FIG. 4 is a cross-sectional side view of another example optoelectronic assembly.

FIG. 4 is a cross-sectional side view of another example optoelectronic assembly 400, arranged in accordance with at least one embodiment described herein. As illustrated, the optoelectronic assembly 400 may include a PIC 402, a housing or LLAMA 404, a GCL laser 406, an optical isolator 408, one or more vias 410, various mounts 412, 414, 416, and one or more contact pads 422. The PIC 402, the GCL laser 406, the vias 412, the isolator 408, and the contact pads 422 of FIG. 4 may be the same as or similar to the PIC 102, 202, 302, the GCL laser 106, 206, 306, the vias 110, 310, the isolator 103, 208, 308, and the contact pads 122, 322 of any of FIGS. 1-3.

In these or other embodiments, the housing 404 may cooperate with the PIC 402 to house one or more elements such as the GCL laser 406 and the isolator 408. Both the GCL laser 406 and the isolator 408 may be housed inside a cavity or receptacle 418 of the housing 404.

In some embodiments, the mounts 412, 414, 416 in FIG. 4 may include controlled surfaces and/or may be made of ceramics or other semiconductor materials. In some embodiments, laser mounts 412 may include a controlled surface of the housing 404, or of a spacer coupled to the housing 404, corresponding to a top surface of the GCL laser 406. In some embodiments, PIC mounts 416 may include a controlled surface of the housing, or of a spacer coupled to the housing 404, corresponding to a top surface of the PIC 402. In some embodiments, isolator mounts 414 may include a controlled surface of the PIC 402, or of a spacer coupled to the PIC 402, corresponding to a bottom surface of the isolator 408. In these or other embodiments, the respective controlled surfaces of at least the PIC mount 416 and the laser mount 412 may result in relative, approximate parallelism between the PIC 402 and the GCL laser 406 since the PIC mount 416 and the laser mount 412 may be approximately parallel to each other. Additionally or alternatively, spacers may be used between one or more portions of the housing 404. For example, the housing 404 may be assembled in a piece-wise fashion or by stacking layers of portions of the housing 404 together with precisely controlled spacers between the various layers or sections. Additionally or alternatively, the spacers may help to form a waffle-like structure due to cavities created between one or more elements.

As also illustrated in FIG. 4, both of the GCL laser 406 and the PIC 402 may be configured to be bonded to the housing 404, e.g., via the mounts 412, 414, 416 and/or spacers, but not to each other. Similarly, the GCL laser 406 may not be bonded to the isolator 408. For example, the isolator 408 may be bonded to a top surface of the PIC 402. In this manner, surface imperfections and/or stacked tolerances may not amount to excessive tilt angles that may otherwise (if bonded together) accumulate between the GCL laser 406 and the PIC 402 and between the GCL laser 406 and the isolator 408. Thus, at least the GCL laser 406 may be offset relative to the isolator 408 and the PIC 402.

In some embodiments, the receptacle 418 of the housing 404 may be defined by various surfaces and walls. For example, the receptacle 418 may be positioned and/or defined in a central portion of the housing 404 and may include partial bounds such as side walls of housing side sections 404A positioned between the PIC mount 416 and a top housing section 404B. Other partial bounds of the receptacle 418 may include the laser mount 412 itself. Additionally or alternatively, wall surfaces between the laser mount(s) 412 and/or a bottom surface of the top housing section 404B may partially bound the receptacle 418 of the housing 404. In these or other embodiments, the various surfaces and walls partially bounding the receptacle 418 may be angled relative to the y-direction, approximately parallel to the y-direction, or approximately perpendicular to the y-direction. For example, as illustrated in FIG. 4, the side walls may be approximately parallel to the y-direction, which may allow for a reduced footprint compared to a footprint of angled side walls. More generally, slopes of the various surfaces of the receptacle 418 may be the same or different, depending on a desired application and/or fabrication process. For example, dry etching (e.g., on Silicon) may allow one or more side walls to be formed approximately parallel to the y-direction.

Figure 5:
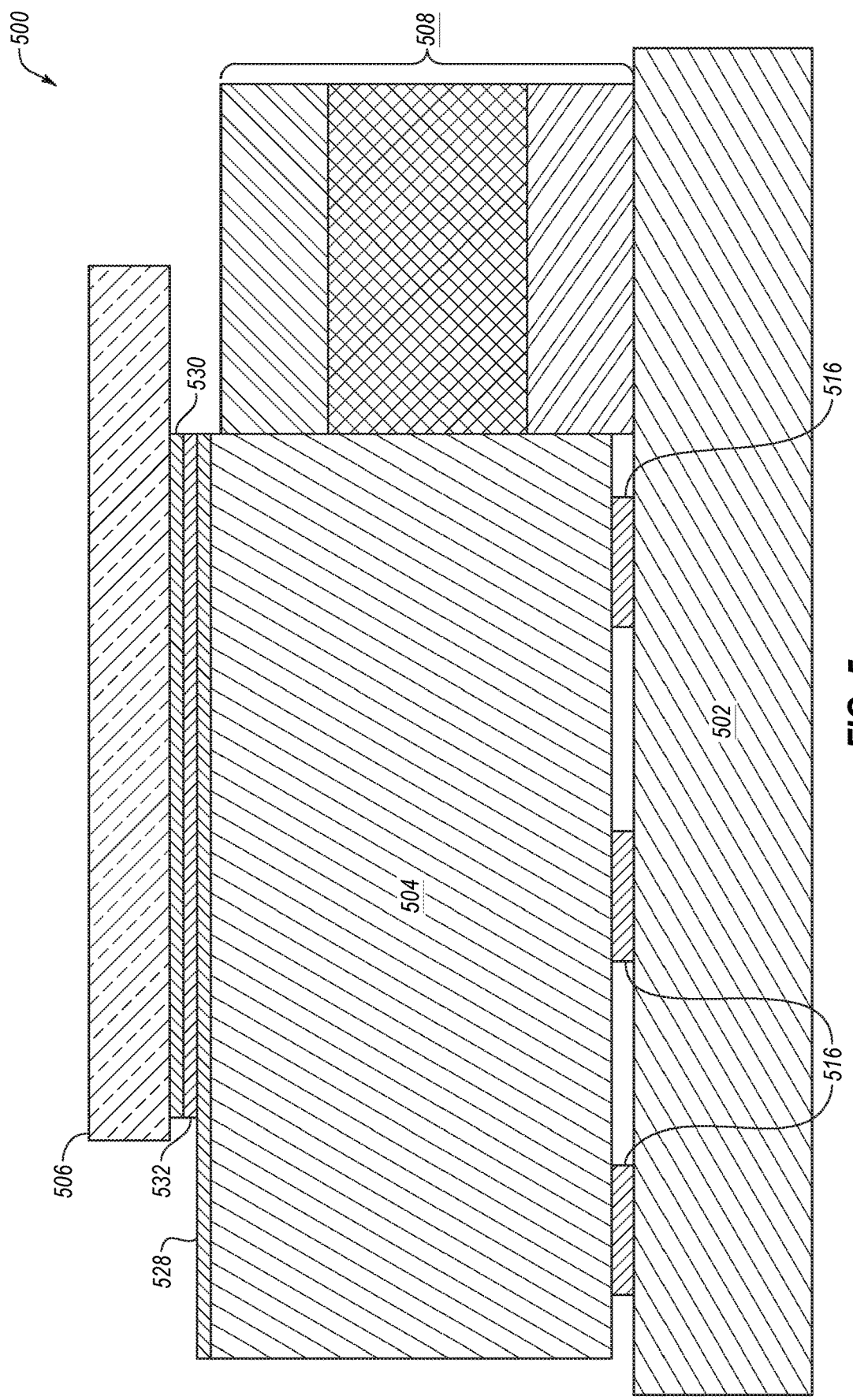
FIG. 5 is a cross-sectional side view of another example optoelectronic assembly.

FIG. 5 is a cross-sectional side view of another example optoelectronic assembly 500, arranged in accordance with at least one embodiment described herein. As illustrated, the optoelectronic assembly 500 may include a PIC 502, a housing or LLAMA 504, a GCL laser 506, an optical isolator (hereinafter "isolator") 508, PIC mounts 516, and various bonding interfaces including contacts 528, 530 and solder 532. The optoelectronic assembly 500 of FIG. 5 may be the same as or similar to the optoelectronic assembly 100 of FIG. 1 and/or other example embodiments illustrated in the figures. Additionally or alternatively however, according to FIG. 5 the isolator 508 may be positioned adjacent to the LLAMA 504. Additionally or alternatively, no laser mount may be included. Rather, the GCL laser 506 may be coupled to the LLAMA 504 via a bonding interface that includes the contacts 528, 530 and the solder 532. In some embodiments, the contacts 528, 530 may be or include gold contacts, and the solder 532 may be a gold-tin alloy. In this manner, the GCL laser 506 may be mechanically, electrically, and/or thermally coupled to the LLAMA 504. Other embodiments as described in this disclosure, though not illustrated, may include the same or similar bonding interfaces with the contacts 528, 530 and the solder 532 described above.

Additionally or alternatively, the LLAMA 504 may not include any cavities since no element may be positioned inside or even partially inside the LLAMA 504. For example, the LLAMA 504 may be a solid block. Additionally or alternatively, the LLAMA 504 may act as a spacer between the laser 506 and the isolator 508 and/or the PIC 502. In these or other embodiments, the bonding interface including the contacts 528, 530 and the solder 532 may couple to a first portion of the GCL laser 506. A second portion of the GCL laser 506 may not be coupled to the bonding interface, and may instead be cantilevered above the isolator 508. The GCL laser 506 may emit light from the second portion of the GCL laser 506 into the isolator 508, which may then be coupled into the PIC 502 after passing through the isolator 508. The LLAMA 504 may be coupled to the PIC 502 via the PIC mounts 516. The PIC mounts 516 may be positioned at an opposite surface of the LLAMA 504 from the bonding interface with the GCL laser 506. The PIC mounts 516 may be formed in the LLAMA 504. Alternatively, the PIC mounts 516 may include one or more post-processed metal layers formed on a surface of the PIC 502.

Figure 6:
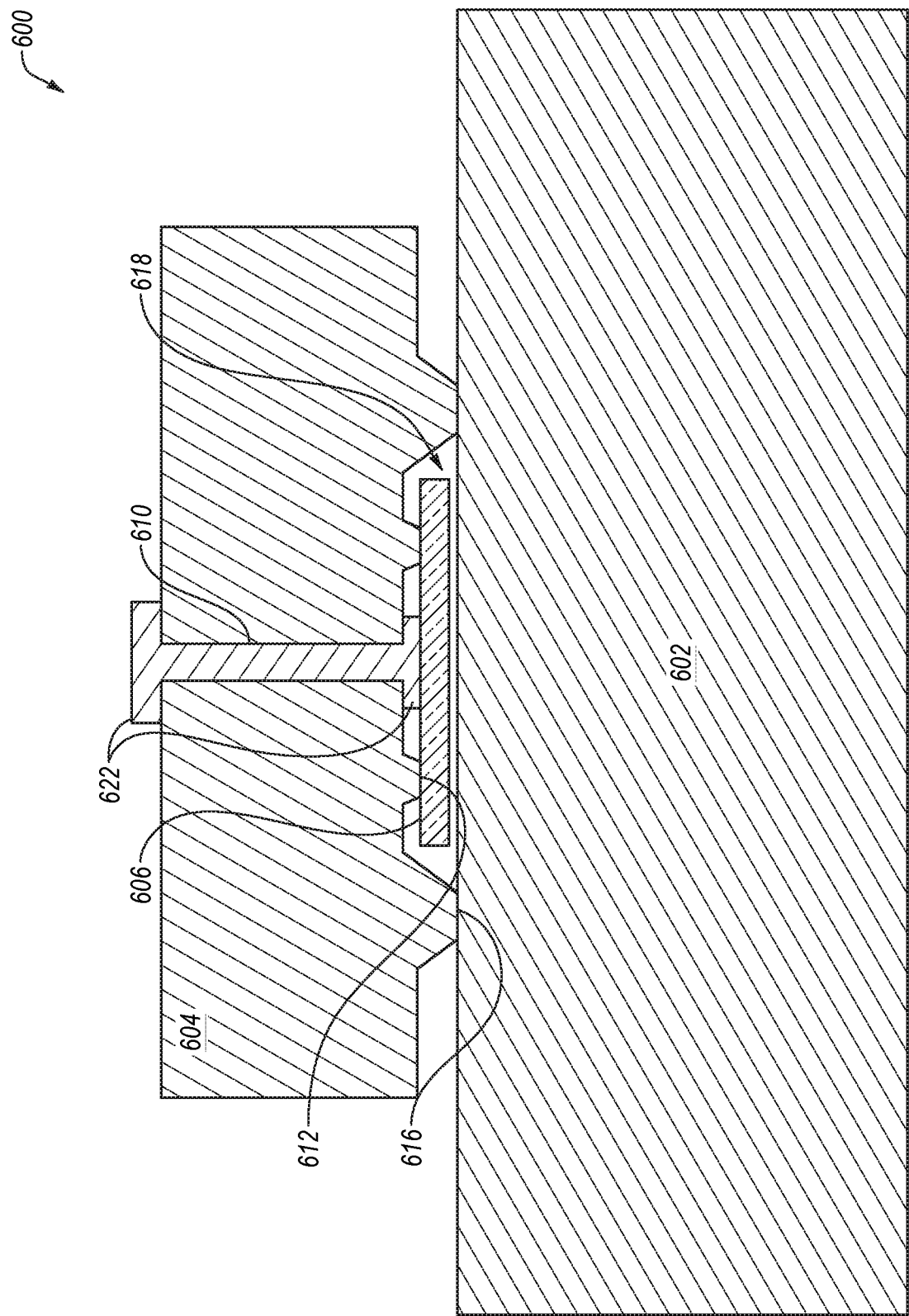
FIG. 6 is a cross-sectional side view of another example optoelectronic assembly.

The optoelectronic assemblies 100, 200, 300, 400, 500 of FIGS. 1-5 each includes an isolator 108, 208, 308, 408, 508. Optionally, however, the isolator may be omitted. For example, FIG. 6 is a cross-sectional side view of another example optoelectronic assembly 600, arranged in accordance with at least one embodiment described herein. As illustrated, the optoelectronic assembly 600 may include a PIC 602, a housing or LLAMA 604, a GCL laser 606, one or more vias 610, a laser mount 612, and a PIC mount 616, (collectively "mounts 612, 616"). The optoelectronic assembly of 600 FIG. 6 may be the same as or similar to the optoelectronic assembly 300 of FIG. 3 and/or other example embodiments illustrated in the figures. The optoelectronic assembly 600 according to FIG. 6, however, does not include an isolator. Other embodiments disclosed herein may be analogously modified to omit any isolator therefrom.

Figure 7:
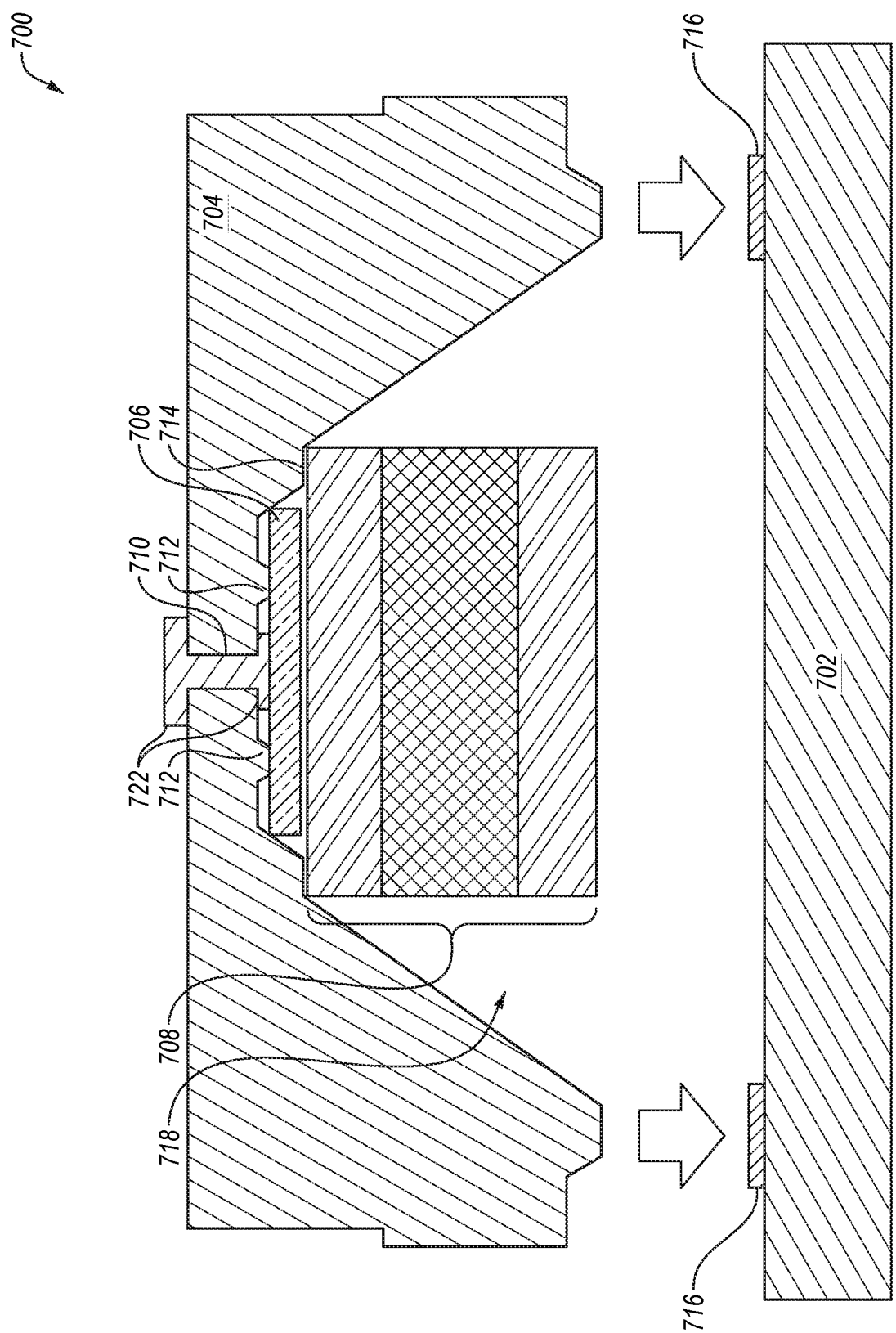
FIG. 7 is a cross-sectional side view of another example optoelectronic assembly.

FIG. 7 is a cross-sectional side view of another example optoelectronic assembly 700, arranged in accordance with at least one embodiment described herein. As illustrated, the optoelectronic assembly 700 may include a PIC 702, a housing or LLAMA 704, a GCL laser 706, an optical isolator (hereinafter "isolator") 708, one or more vias 710, one or more contact pads 722, and various mounts 712, 714, 716 including a laser mount 712, an isolator mount 714, and a PIC mount 716. The optoelectronic assembly 700 of FIG. 7 may be the same as or similar to the optoelectronic assembly 100 of FIG. 1 and/or other example embodiments illustrated in the figures. Additionally or alternatively however, the PIC mounts 716 according to FIG. 7 may be or include a layer that is part of, formed on, and/or attached to the PIC 702 itself. For example, the PIC mounts 716 may include a post-processed metal layer of the PIC 702 that is mountable to a corresponding surface of the LLAMA 704. In these or other embodiments, fabrication of the LLAMA 704 may be simplified. For example, the corresponding surfaces of the LLAMA 704 may not be a controlled surface. Rather, the PIC mounts 716 positioned on the PIC 702 may include one or more controlled surfaces configured to interface with the corresponding surfaces of the LLAMA 704.

Figure 8:
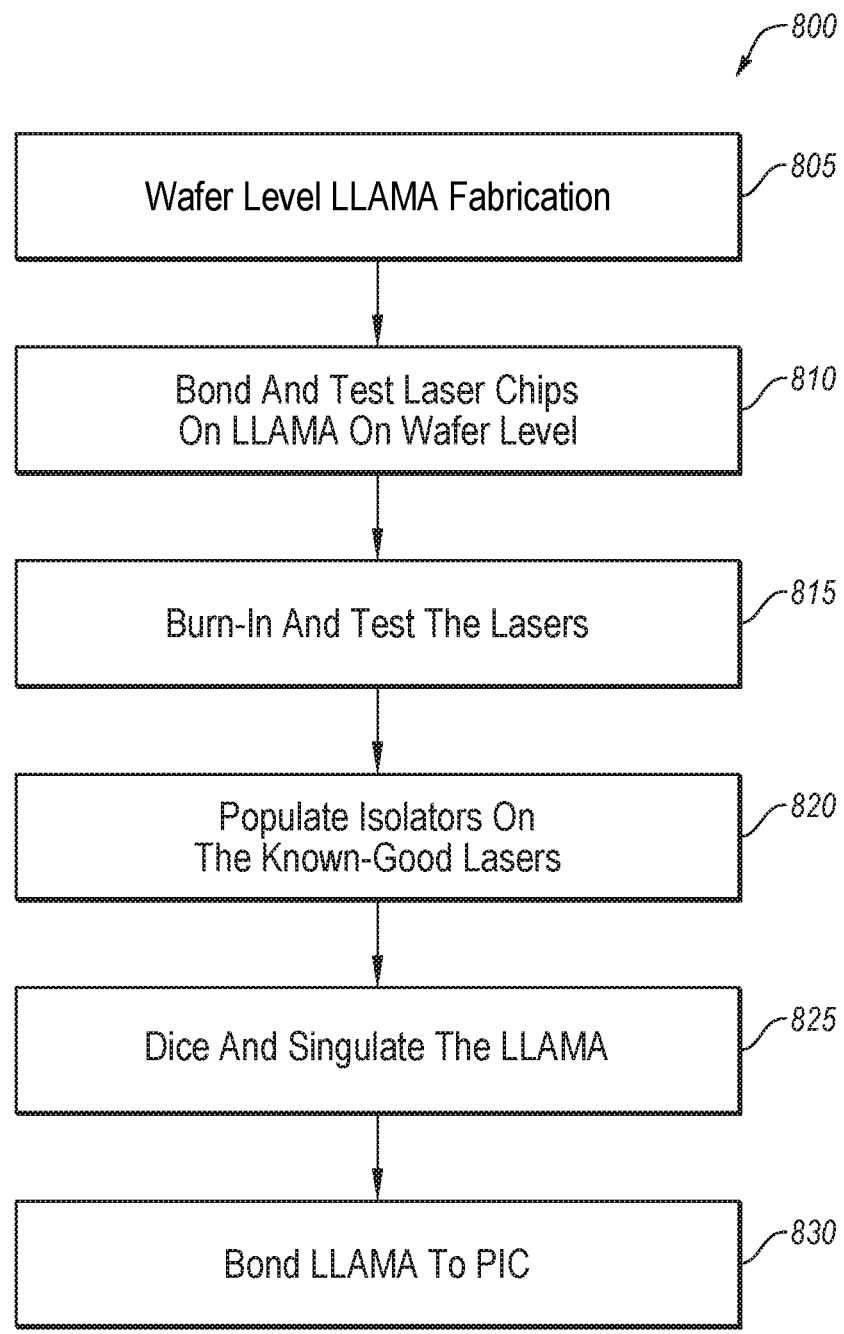
FIG. 8 illustrates a flow diagram of an example method to manufacture an optoelectronic assembly.

FIG. 8 illustrates a flow diagram of an example method 800 to manufacture an optoelectronic assembly, arranged in accordance with at least one embodiment described herein. The method 800 may be arranged to manufacture at least one of the embodiments described herein. In these and other embodiments, some or all of the steps of the method 800 may be performed based on the execution of instructions stored on one or more non-transitory computer-readable media. Although illustrated as discrete blocks, various blocks may be divided into additional blocks, combined into fewer blocks, or eliminated, depending on the desired implementation.

The method 800 may begin at block 805 ("Wafer Level LLAMA Fabrication"), where a housing may be fabricated at the wafer level, for example by an etching process (e.g., wet etching, dry etching). The housing may be the same as or similar to any of the housings discussed herein. Fabricating the housing at the wafer level may include processing a wafer of material to form within the wafer multiple housings. Block 805 may be followed by block 810.

At block 810 ("Bond And Test Laser Chips On LLAMA On Wafer Level"), GCL lasers may be bonded to the housings and tested at the wafer level. In particular, one GCL laser may be bonded to each housing in the wafer of housings and all of the GCL lasers bonded to the wafer of housings may be tested. Bonding each GCL laser to a corresponding one of the housings may include bonding a top or bottom surface of each GCL laser to a corresponding laser mount/controlled surface of the corresponding housing. Block 810 may be followed by block 815.

At block 815 (Burn-in and test the lasers"), the GCL lasers may be burned in and tested. The burn-in may operate the GCL lasers, prior to being placed in service, under supervised and potentially stressful conditions to force failures that would typically occur in a high-failure rate portion of a bathtub curve of GCL laser reliability. Any suitable burn-in may be implemented. Before, during, and/or after burn-in, the GCL lasers may be tested, e.g., to identify and screen out any of the GCL lasers that have failed during burn-in or are likely to fail, as indicated by the testing. Block 815 may be followed by block 820.

At Block 820 ("Populate isolators on the known-good lasers"), optical isolators may be populated to corresponding known good lasers determined in the previous block 815. In particular, one isolator may be populated on each of the known good lasers. In embodiments in which the isolator is bonded to an isolator mount of the housing (see FIGS. 1 and 2), populating isolators on the known good lasers may include bonding each isolator to a corresponding isolator mount or other controlled surface of the corresponding housing to which the corresponding GCL laser is already mounted, as opposed to bonding each isolator directly to the corresponding GCL laser. Block 820 may be followed by block 825.

At block 825 ("Dice And Singulate The LLAMA"), the wafer of housings may be diced and separated into individual housings, each with a GCL laser and an isolator in some embodiments. Alternatively or additionally, the housings of the wafer with GCL lasers that were screened out may be discarded. Block 825 may be followed by block 830.

At block 830 ("Bond LLAMA Tdo PIC"), each of the housings may be bonded to a corresponding PIC. For example, each housing may be bonded to a corresponding PIC at a controlled surface of the housing, which controlled surface may be implemented as, e.g., a PIC mount. In some embodiments, before and/or during bonding of the PIC to the PIC mount, the housing may be semi-passively aligned to the housing. For example, during passive and/or semi-passive alignment, active laser operation may not be required. The bonding process may also include measuring a depth of the receptacle of the housing. Additionally or alternatively, one or more offsets may be determined between any two of the housing, the laser, the isolator, and the PIC during a bonding process for one or more of the respective elements based on at least the depth of the receptacle. Each offset may be adjusted during the bonding process to match a corresponding target offset, at least within a specified tolerance. For example, more or less epoxy or other adhesive to bond the various components together may be used between the components to increase or decrease the offset.

One skilled in the art will appreciate that, for these processes, operations, and methods, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

Figure 9:
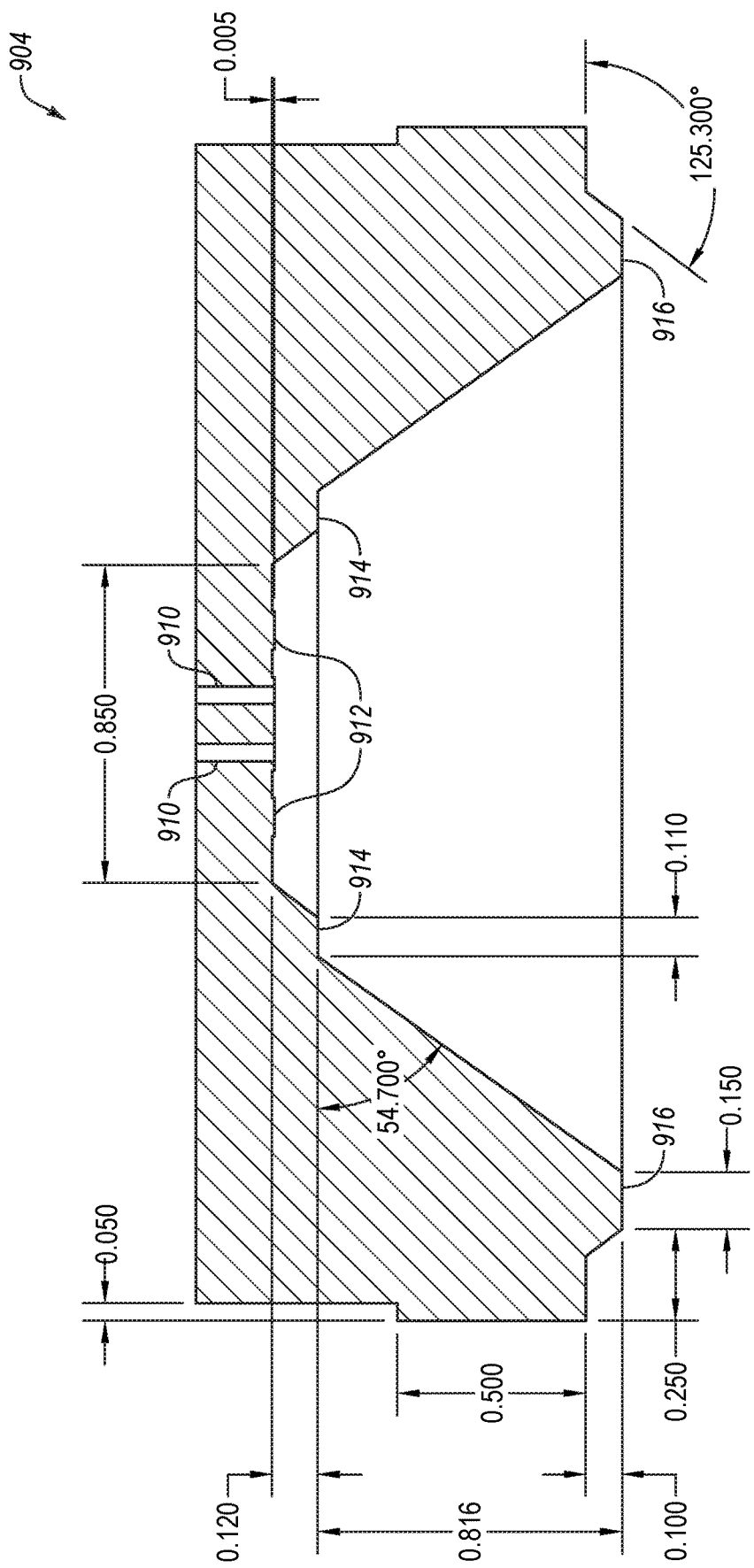
FIG. 9 is a cross-sectional side view of an example implementation of a housing of the optoelectronic assembly of FIG. 1 with various example dimensions of the housing.

FIG. 9 is a cross-sectional side view of an example implementation 904 of the housing 104 of FIG. 1 with various example dimensions of the housing 904, arranged in accordance with at least one embodiment described herein. As illustrated, the housing includes, e.g., vias 910, laser mounts 912, isolator mounts 914, and PIC mounts 916 that may include and/or correspond to the vias 110, laser mounts 112, isolator mounts 114, and PIC mounts 116 of FIG. 1.

Figure 10:
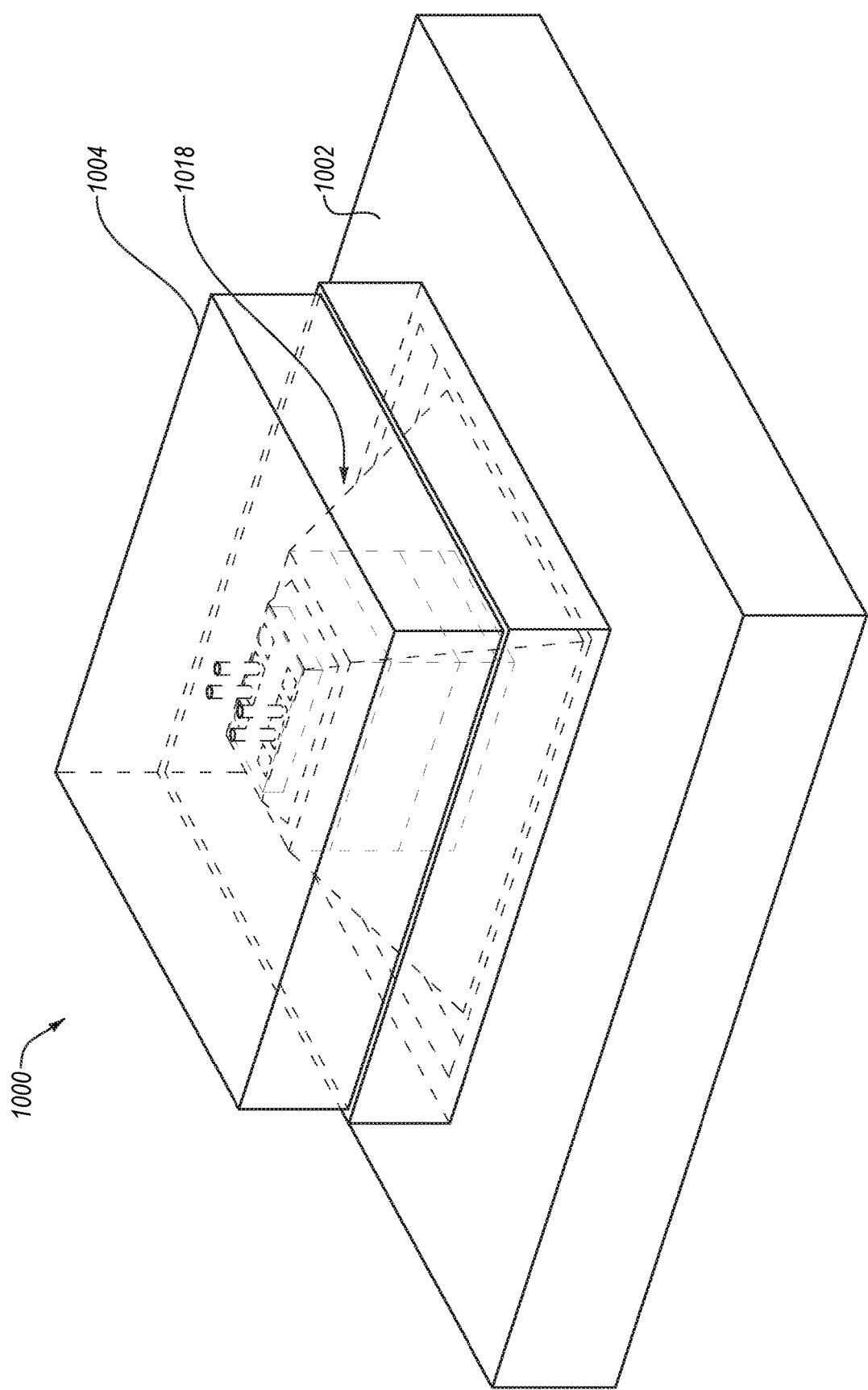
FIG. 10 is a top perspective view of an example implementation of the housing and a PIC of the optoelectronic assembly of FIG. 1, all arranged in accordance with at least one implementation described herein.

FIG. 10 is a top perspective view of an example implementation 1000 of the housing 104 and the PIC 102 of FIG. 1, arranged in accordance with at least one embodiment described herein. The implementation 1000 includes a housing 1004 and a PIC 1002 that may include or correspond to the housing 104 and the PIC 102 of FIG. 1. In FIG. 10, the housing 1004 is depicted as semi-transparent such that a receptacle 1018 at least partially defined by the housing 1004 is visible within an interior of the housing 1004. As illustrated in FIG. 10, the receptacle 1018 may generally have a truncated rectangular pyramid shape.

Various embodiments have been described herein as including or being implemented with a GCL laser. In other embodiments, other types of lasers may be implemented.

Unless specific arrangements described herein are mutually exclusive with one another, the various implementations described herein can be combined to enhance system functionality and/or to produce complementary functions. Such combinations will be readily appreciated by those skilled in the art given the totality of the foregoing description. Likewise, aspects of the implementations may be implemented in standalone arrangements where more limited and thus specific component functionality is provided within each of the interconnected—and therefore interacting—system components albeit that, in sum, they together support, realize and produce the described real-world effect(s). Indeed, it will be understood that unless features in the particular implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will, therefore, be appreciated that the above description has been given by way of example only and that modification in detail may be made within the scope of the present invention.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner. Additionally, the terms "about" and "approximately" should be interpreted to mean 10% of actual value.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. An optoelectronic assembly comprising:
   a photonic integrated circuit (PIC) with a top surface;
   a laser with a top surface and a bottom surface; and
   a housing configured to cooperate with the PIC to one or both of house and support one or more components, the housing including:
      a PIC mount including a first surface to interface with the top surface of the PIC; and
      a laser mount including a second surface to interface with the top or bottom surface of the laser,
   wherein the first surface and the second surface are parallel to each other.

2. The optoelectronic assembly of claim 1, further comprising a receptacle defined in the housing, the receptacle partially bounded by a side wall connected to the laser mount.

3. The optoelectronic assembly of claim 2, further comprising:
   an optical isolator with a top surface; and
   an isolator mount of the housing including a third surface to interface with the top surface of the optical isolator, the third surface parallel to both the first surface and the second surface.

4. The optoelectronic assembly of claim 3, wherein:
   the receptacle is partially bounded by both of the second surface and the third surface;

the one or more housed components include both the laser and the optical isolator positioned within the receptacle of the housing;
at least a portion of the top surface of the laser is mounted to the second surface; and
at least a portion of the top surface of the optical isolator is mounted to the third surface.

5. The optoelectronic assembly of claim 3, wherein:
the second surface is a top surface of the housing outside the receptacle;
the laser is positioned outside the receptacle with at least a portion of the bottom surface of the laser mounted to the second surface;
the receptacle is partially bounded by the third surface; and
the one or more housed components include the optical isolator positioned within the receptacle with at least a portion of the top surface of the optical isolator mounted to the third surface.

6. The optoelectronic assembly of claim 2, further comprising an optical isolator with a bottom surface to interface with the top surface of the PIC, the one or more housed components including the optical isolator positioned between the housing and the PIC.

7. The optoelectronic assembly of claim 6, wherein the optical isolator is at least partially received inside a recess of the PIC.

8. The optoelectronic assembly of claim 6, wherein the first mount and the second mount are spacers.

9. The optoelectronic assembly of claim 8, wherein the housing includes a top section and a sidewall section separated from the top section by one or more spacers.

10. The optoelectronic assembly of claim 1, wherein the housing is optically transparent.

11. The optoelectronic assembly of claim 1, further comprising one or more vias formed in the housing and that pass through a top of the housing.

12. The optoelectronic assembly of claim 1, wherein the laser is a grating coupled laser, and the optoelectronic assembly further comprises a surface grating positioned on the PIC to optically couple the laser and the PIC.

13. The optoelectronic assembly of claim 1, wherein the laser mount includes a waffle-like structure, the waffle-like structure including the second surface raised relative to a cavity surface that at least partially defines a cavity adjacent to the second surface.

14. The optoelectronic assembly of claim 13, further comprising an adhesive disposed in the cavity adjacent to the second surface.

15. The optoelectronic assembly of claim 1, further comprising:
an optical isolator with a top surface; and
an isolator mount at least partially defining a waffle-like structure that includes:
a third surface of the isolator mount that interfaces with the top surface of the optical isolator; and
the third surface raised relative to a cavity surface at least partially defining a cavity adjacent to the third surface.

16. The optoelectronic assembly of claim 15, further comprising an adhesive disposed in the cavity adjacent to the third surface.

17. The optoelectronic assembly of claim 1, wherein the laser mount includes a bonding interface that includes contacts and solder.

18. The optoelectronic assembly of claim 17, wherein a first portion of the laser is coupled to the bonding interface and a second portion of the laser is cantilevered over an optical isolator positioned adjacent to the housing.

19. A method to manufacture an optoelectronic assembly, the method comprising:
etching a wafer to form a plurality of housings in the wafer, each of the housings configured to house one or both of a laser and an optical isolator, wherein forming the housings in the wafer comprises:
forming a receptacle of each of the housings in the wafer;
forming a photonic integrated circuit (PIC) mount of each of the housings in the wafer, each PIC mount including a first surface to interface with a top surface of a corresponding PIC; and
forming a laser mount of each of the housings in the wafer, each laser mount including a second surface to interface with a top surface or a bottom surface of a corresponding laser,
wherein the first surface and the second surface are parallel to each other.

20. The method of claim 19, wherein forming the housings in the wafer further comprises forming an isolator mount of each of the housings in the wafer, each isolator mount including a third surface to interface with a top surface of a corresponding optical isolator, wherein the third surface is parallel to both the first surface and the second surface.

21. The method of claim 20, further comprising:
bonding a portion of the top surface of each corresponding laser to the corresponding second surface of the corresponding housing with each corresponding laser positioned within the corresponding receptacle of the corresponding housing; and
bonding a portion of the top surface of each corresponding optical isolator to the corresponding third surface of the corresponding housing with each corresponding optical isolator positioned within the corresponding receptacle of the corresponding housing,
wherein each corresponding receptacle is partially bounded by both of the corresponding second surface and the corresponding third surface.

22. The method of claim 20, further comprising:
bonding the bottom surface of the corresponding laser to the corresponding second surface of the corresponding housing, wherein the corresponding second surface is a top surface of the corresponding housing that is outside the corresponding receptacle; and
bonding the top surface of the corresponding optical isolator to the corresponding third surface of the corresponding housing, wherein the corresponding third surface partially bounds the corresponding receptacle.

23. The method of claim 19, further comprising bonding a bottom surface of a corresponding optical isolator to the top surface of each corresponding PIC, each of the corresponding optical isolators configured to be housed between the corresponding housing and the corresponding PIC.

24. The method of claim 23, further comprising, prior to the bonding, positioning the corresponding optical isolator at least partially within a recess of the corresponding PIC.

25. The method of claim 23, further comprising manufacturing spacers as the PIC mount and the laser mount.

26. The method of claim 19, further comprising:
forming an isolator mount of each of the housings in the wafer, each isolator mount including a third surface to interface with a top surface of a corresponding optical isolator, wherein the third surface is parallel to both the first surface and the second surface;

bonding a corresponding laser to the corresponding laser mount of the corresponding housing such that a plurality of lasers are bonded to a plurality of laser mounts of a plurality of housings;
testing the plurality of lasers at a wafer level;
performing burn-in testing of the plurality of lasers to identify a plurality of good lasers and a plurality of screened out lasers;
populating corresponding optical isolators on the plurality of good lasers;
dicing and singulating the wafer into the plurality of housings; and
bonding corresponding PICs to corresponding PIC mounts of the corresponding housings.

27. The method of claim 26, further comprising, for each optoelectronic assembly comprising a corresponding housing, a corresponding laser, a corresponding optical isolator, and a corresponding PIC:

semi-passively aligning the corresponding housing with the corresponding PIC before and/or during bonding of the PIC to the PIC mount;
measuring a depth of the corresponding receptacle;
determining an offset between any two of the corresponding housing, the corresponding laser, the corresponding optical isolator and the corresponding PIC during a bonding process for one or more of the respective elements based on at least the depth of the receptacle; and
adjusting the offset to match a target offset.

28. The method of claim 19, wherein etching the wafer to form the plurality of housings includes dry etching to form a side wall of the receptacle that is perpendicular to the first surface and the second surface.

* * * * *